United States Patent
Ishii et al.

(10) Patent No.: US 11,984,862 B2
(45) Date of Patent: May 14, 2024

(54) NOISE FILTER

(71) Applicant: OMRON Corporation, Kyoto (JP)

(72) Inventors: Takanori Ishii, Kyoto (JP); Chen Chen, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 47 days.

(21) Appl. No.: 17/796,452

(22) PCT Filed: Dec. 16, 2020

(86) PCT No.: PCT/JP2020/046902
§ 371 (c)(1),
(2) Date: Jul. 29, 2022

(87) PCT Pub. No.: WO2021/166397
PCT Pub. Date: Aug. 26, 2021

(65) Prior Publication Data
US 2023/0045961 A1 Feb. 16, 2023

(30) Foreign Application Priority Data
Feb. 18, 2020 (JP) .................. 2020-025152

(51) Int. Cl.
*H02J 3/00* (2006.01)
*H03H 11/04* (2006.01)

(52) U.S. Cl.
CPC ............. *H03H 11/04* (2013.01); *H02J 3/001* (2020.01)

(58) Field of Classification Search
CPC .......... H02J 3/001; H02M 1/123; H02M 1/15; H02M 1/12
See application file for complete search history.

(56) References Cited

U.S. PATENT DOCUMENTS 5,793,623 A 8/1998 Kawashima et al.
2002/0175748 A1* 11/2002 Nishikawa ............... H05K 1/16
327/552
(Continued)

FOREIGN PATENT DOCUMENTS

| JP | 108182306 A | 7/1996 |
| JP | 2001037084 A | 2/2001 |

(Continued)

OTHER PUBLICATIONS

International Search Report issued in Intl. Appln. No. PCT/JP2020/046902 dated Feb. 16, 2021. English translation provided.
(Continued)

*Primary Examiner* — Sibin Chen
(74) *Attorney, Agent, or Firm* — ROSSI, KIMMS & McDOWELL LLP

(57) ABSTRACT

Provided is an active filter circuit connected to a power-receiving terminal of a power line for an alternating-current power supplied to a power converter device from an alternating-current power grid or a direct-current power source interconnected with the alternating-current power grid, or for a direct-current power supplied from the direct-current
(Continued)

power source for reducing a harmonic component of a conduction noise propagating to the power line and outputting the reduced harmonic; and a controller for monitoring a variation in the state of an input power entering a power source module for generating drive power for an active element constituting the active filter circuit, or a variation in the state of the drive power supplied from the power source module, and diagnosing an abnormality of a circuit operation for a circuit including the active element of the active filter circuit therein.

7 Claims, 12 Drawing Sheets

(56) References Cited

U.S. PATENT DOCUMENTS

| | | | |
|---|---|---|---|
| 2005/0157525 A1* | 7/2005 | Hanson | H02M 1/10 363/65 |
| 2006/0114642 A1* | 6/2006 | Liu | H02J 3/1892 361/500 |
| 2019/0260198 A1* | 8/2019 | Sonehara | B60R 16/02 |
| 2020/0083835 A1 | 3/2020 | Kobayashi et al. | |
| 2021/0010707 A1 | 1/2021 | Takahashi et al. | |

FOREIGN PATENT DOCUMENTS

| | | |
|---|---|---|
| JP | 2003088099 A | 3/2003 |
| JP | 2019176679 A | 10/2019 |
| WO | 2018109801 A1 | 6/2018 |

OTHER PUBLICATIONS

Written Opinion issued in Intl. Appln. No. PCT/JP2020/046902 dated Feb. 16, 2021. English translation provided.
Extended European Search Report issued in European Appln. No. 20920168.0, dated Dec. 13, 2023.
Benslimane. "Open Switch Faults Detection and Localization Algorithm for Three Phase Shunt Active Power Filter based on Two Level Voltage Source Inverter." Istanbul University Journal of Electronics and Electrical Engineering. 2007: 21-24. vol. 2. No. 74. Cited in NPL1.
Xie et al. "Research on Failure Diagnosis and Tolerant Control Strategy of Active Power Filter." 2018 13th IEEE Conference on Industrial Electronics and Applications (ICIEA), IEEE. 2018: 1374-1379. Cited in NPL1.
Karimi et al. "Current sensors and power switches fault detection and compensation for shunt active power filters." Industrial Electronics, 2007. ISIE 2007. IEEE International Symposium on, IEEE, PI. Jun. 1, 2007: 3157-3161. Cited in NPL1.

* cited by examiner

Fig. 7

| Location | Specifics | Points Measured | Assessment Condition | Detection Timing | |
|---|---|---|---|---|---|
| | | | | Before Operation | Post Operation Start |
| TR | Open | Ip or In | Below Threshold A | Yes | NA |
| TR | Short | Ip or In | Above Threshold B | Yes | NA |
| OP Amp | Open | Ip or In | Below Threshold A | Yes | NA |
| OP Amp | Short | Two of Ip, In, and Ig | Above Threshold B | Yes | NA |
| Injector Unit | Open | Ig | Below Threshold C | NA | Yes |
| Injector Unit | Short | Ig | Above Threshold D | NA | Yes |

FIG. 11A
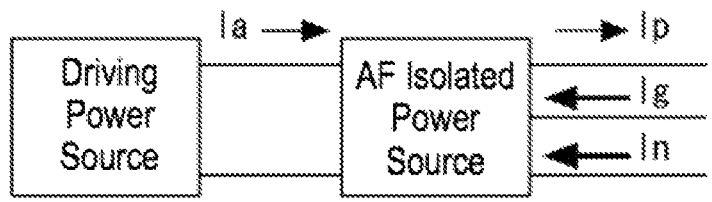
Detecting failure from current supplied
to AF isolated power source
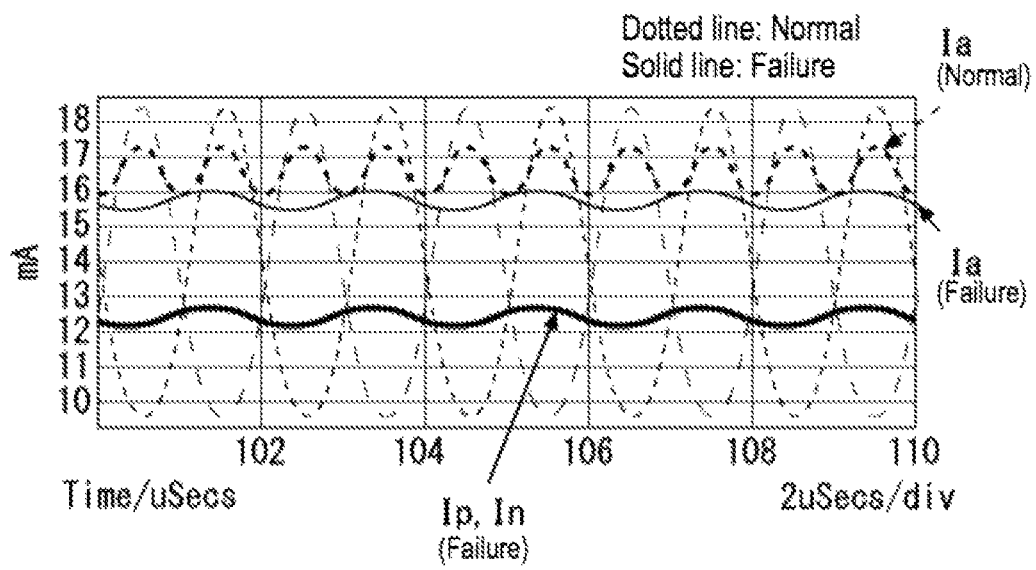

NOISE FILTER

TECHNICAL FIELD

The present invention relates to a noise filter for suppressing the conduction noise in a power conditioner.

BACKGROUND

A power system may be equipped with a direct current power source such as a solar power module or a storage battery and connected to commercial power supplied from a grid. Such power systems are known to include a power converter device (power conditioner) for converting power from direct current to alternating current (or from alternating current to direct current). A noise filter can be provided to the power converter device at the input side and the output side respectively where direct current power and alternating current power are supplied to minimize conduction noise, such as common mode noise or normal mode noise.

A typical noise filter may be configured from a passive element as illustrated in FIG. 12. Specifically, a noise filter may be constituted by a reactor (CMC: common mode coil) functioning as a common mode filter and a capacitor (Cx1, Cy1, Cy2) provided at the input side and a capacitor (Cx2, Cy3, Cy4) provided at the output side of the aforementioned reactor. The capacitor Cx1 provided at the input side and the capacitor Cx2 provided at the output side of the reactor function as an X-capacitor connected between a power lines and suppress normal mode noise. The capacitors Cy1 and Cy2 provided at the input side, and the capacitors Cy3 and Cy4 provided at the output side of the reactor connect the power lines and a frame ground (FG), which is a reference potential, and serve as a Y-capacitor that releases the common mode noise current of the power lines to the reference potential on the FG, etc. The reactor, the Y capacitor provided at the input side and the Y capacitor provided at the output side of the aforementioned reactor constitute an LC filter.

In a passive filter constituted by this kind of passive element, when a large amount of power is being converted (e.g., on the order of several kilowatts), the thickness of the wiring in a reactor increases because the current flowing through the reactor constituting the passive filter is relatively larger. When the wiring in the reactor is relatively thicker, the noise filter including a reactor such as a CMC also increases in size, and the power converter device that includes the aforementioned noise filter in its configuration must also necessarily increase in size. From the desire to have smaller power converter devices, a recent trend is hybridization by combining a passive filter configured from a passive element with an active filter; and noise filters that can be downsized while controlling size are becoming mainstream.

However, an active filter can include an active element in the configuration such as an operational amplifier or a transistor; therefore, the active filter tends to fail more easily compared to a passive filter configured from a passive element. Consequently, when the active filter fails, essentially, there is a relative increase in the conduction noise that should be reduced by the noise filter. In cases where the power converter device continues to operate while, for instance, the active filter has failed, the conduction noise with respect to machines connected to and operating with the aforementioned power converter device can propagate to surrounding machines, causing the aforementioned machines to malfunction, etc.

The following patent documents are among the related art documents that disclose features pertaining to the features described in the present specification.

RELATED ART DOCUMENTS

Patent Documents

[Patent Document 1] Japanese Patent Publication No. 2003-88099
[Patent Document 2] International Publication Number 2018/109801

SUMMARY

Technical Problem

In view of the foregoing, the present invention provides a technology for detecting a failure of a noise filter that includes an active filter in the configuration thereof and allows for preventing transmission of conduction noise to surrounding machines.

Solution to Problem

A noise filter according to the present invention for addressing the above-mentioned problems includes:

an active filter circuit connected to a power-receiving terminal of a power line for an alternating-current power supplied to a power converter device from an alternating-current power grid or a direct-current power source interconnected with the alternating-current power grid, or for a direct-current power supplied from the direct-current power source for reducing a harmonic component of a conduction noise propagating to the power line and outputting the reduced harmonic component to the power line; and a controller for monitoring a variation in the state of an input power entering a power source module for generating drive power for an active element constituting the active filter circuit, or a variation in the state of the drive power supplied from the power source module, and diagnosing an abnormality of a circuit operation for a circuit including the active element of the active filter circuit therein on the basis of a variation in the state of the input power or a variation in the state of the drive power.

Hereby, the behavior of a power source module may be monitored via active filter that is connected to a power-receiving terminal of a power line for an alternating-current power supplied to a power converter device from an alternating-current power grid or a direct-current power source interconnected with the alternating-current power grid, or for a direct-current power supplied from the direct-current power and a failure (abnormality) or normal operation of the aforementioned active filter may be diagnosed. The present invention is capable of detecting the failure of a noise filter that includes an active filter in its configuration.

In the present invention, when diagnosing that an abnormality occurred in the circuit operation of the active filter circuit that includes the active element on the basis of the variation in the state of the drive power, the controller may suspend the operation of the power converter device. Thus, if the active filter is diagnosed as having failed, the operation of the power converter device having the noise filter in the configuration thereof can be suspended. The present invention prevents the conduction noise that would accompany a failure of the active filter from propagating to surrounding machines.

In the present invention, when diagnosing that the circuit operation of the active filter circuit that includes the active element is normal on the basis of the variation in the state of the drive power, the controller may continue the operation of the power converter device. Thus, when the filter is diagnosed as being in normal operation, the power converter device continues to operate, thus improving the working rate of the aforementioned power converter device, and the harmonic component in the conduction noise propagating to the power line can be reduced via the aforementioned active filter.

In the present invention, the power source module may include a positive power source for generating a positive-side voltage and a negative power source for generating a negative-side voltage. The controller may monitor the variation in the state of the drive power supplied from the power source module on the basis of at least any one current of a first current flowing from the positive power source of the power source module to a reference potential, a second current flowing from a negative power source in the power source module to a reference potential, and a third current flowing from a connection point for connecting the negative-side electrode of the positive power source and the positive-side electrode of the negative power source to a reference potential. Thus, the variation in the state of the drive power supplied from the power source module on the basis of any one current of a first current (Ip) flowing from the positive power source of the power source module to a reference potential, a second current (In) flowing from a negative power source in the power source module to a reference potential, and a third current (Ig) flowing from a connection point for connecting the negative-side electrode of the positive power source and the positive-side electrode of the negative power source to a reference potential can be monitored.

The controller may diagnose an abnormality in the circuit operation of a circuit including the active element of the active filter circuit on the basis of a first current flowing from the positive power source of the power source module to a reference potential or a second current flowing from a negative power source in the power source module to a reference potential, and a third current flowing from a connection point for connecting the negative-side electrode of the positive power source and the positive-side electrode of the negative power source to a reference potential. Hereby, the noise filter is capable of increasing the diagnostic reliability of a failure diagnosis.

In the present invention, the controller may determine that the circuit operation of the circuit including the active element of the active filter circuit is normal when the first current or the second current is at or above a first threshold and is at or below a second threshold that is greater than the first threshold. A failure diagnosis is hereby possible by using that the first current or the second current is within a predetermined range (a range of at or above a first threshold and at or below a second threshold).

In the present invention, the controller may determine that the circuit operation of the circuit including the active element of the active filter circuit is normal when the third current is at or above a third threshold and is at or below a fourth threshold that is greater than the third threshold. A failure diagnosis is hereby possible by using that the third current is within a predetermined range (a range of at or above a third threshold and at or below a fourth threshold).

The present invention may further include a passive filter for a power line which is supplied the alternating-current power supplied to a power converter device from an alternating-current power grid or a direct-current power source interconnected with the alternating-current power grid or is supplied from the direct-current power source on the power converter device side for reducing the common mode noise propagating to the power line. Hereby, it is possible to implement a hybrid noise filter in which the passive filter is capable of minimizing the common mode noise, and the active filter is capable of minimizing the harmonic component in the conduction noise.

Effects

The present invention detects a failure of a noise filter that includes an active filter in the configuration thereof and prevents transmission of conduction noise to surrounding machines.

BRIEF DESCRIPTION OF THE DRAWINGS

FIG. 7 is one example of a table presenting conditions for a failure assessment of the active filter in the first embodiment of the present invention;

FIGS. 11A, 11B, and 11C are examples of graphs modeling a variation in a current on a primary side and accompanying the failure of the active filter in a modification example of the second embodiment of the present invention.

DETAILED DESCRIPTION

Example Application

Figure 1:
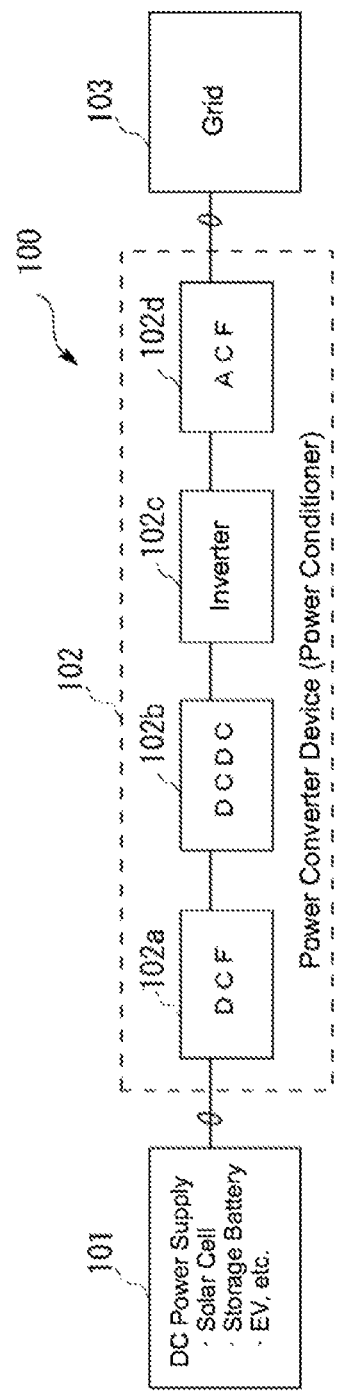
FIG. 1 is a block diagram illustrating a schematic configuration of a power system in a first embodiment of the present invention.

An example application of the present invention is described below with reference to the drawings. FIG. 1 is a block diagram of a power system 100 provided with a power converter device 102 that employs a noise filter 1 of an example application of the present invention. FIG. 1 provides an example of the resource configuration of a grid-connectable power system which interconnects a DC power supply 101 that supplies direct-current power and a commercial power grid 103 (also referred to as "grid" below) that supplies alternating current power.

The power converter device 102 includes in the configuration thereof a DC-DC converter 102b and an inverter 102c for converting direct-current power supplied from the DC power supply 101 to alternating-current power synchronized with the power supplied from the grid, or converting the alternating-current power supplied from the grid to direct-current power synchronized with the power supplied from the DC power supply 101. The power converter device 102 also includes in the configuration thereof a DCF 102a and an ACF 102d, also called a noise filter, for minimizing the conduction noise (common mode noise or normal mode noise) derived from a conversion process from direct-current power to alternating-current power or alternating-current power to direct-current power (boost/buck conversion, frequency conversion, etc.). The DCF 102a inside the noise filter is provided at the input-output end parts on the DC power supply 101 side of a power converter unit 102, and the ACF 102d is provided at the input-output end parts on the grid side 103 of the power converter unit 102. The DCF 102a and ACF 102d have different voltage specifications, current specifications, or the like in accordance with the difference in direct current and alternating current; however, the constituent parts making up the respective circuits may be roughly the same.

Figure 2:
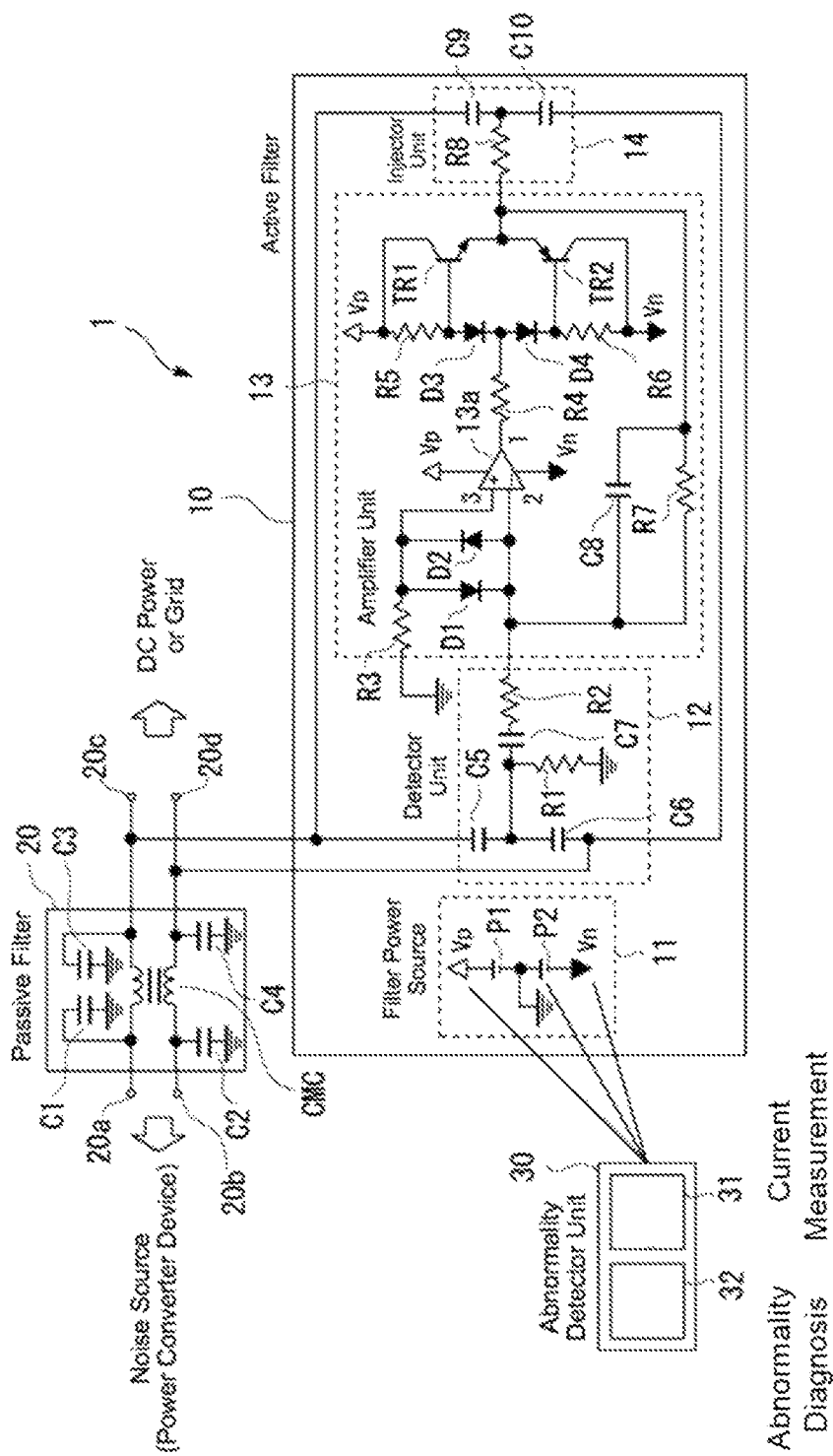
FIG. 2 is a block diagram illustrating a resource circuit configuration of a noise filter in the first embodiment of the present invention.

FIG. 2 is a block diagram illustrating a resource circuit configuration of a noise filter 1 according to the first embodiment of the present invention. As illustrated in FIG. 2, the noise filter 1 according to the example application of the present invention is configured as a hybrid noise filter that combines a passive filter 20 and an active filter 10. The passive filter 20 in the noise filter 1 may be provided at the noise source (the power converter circuit (the DC-DC converter 102b, the inverter 102c, etc.)), and minimizes the common mode noise current that propagates on the power line connected to the terminals 20a, 20B. The active filter 10 according to the example application of the present invention is connected to the terminal 20c and the terminal 20d of the power line at the power-source side (DC power supply 101, grid 103) of the passive filter 20 that is supplying direct-current or alternating-current power; the active filter 10 detects the high frequency component in the conduction noise propagating to the aforementioned power line and functions to reduce the harmonic current corresponding to the aforementioned high frequency component. The active filter 10 includes active elements such as an operational amplifier 13a, a transistor TR1, a transistor TR2, etc., in the circuit configuration thereof.

Figure 3:
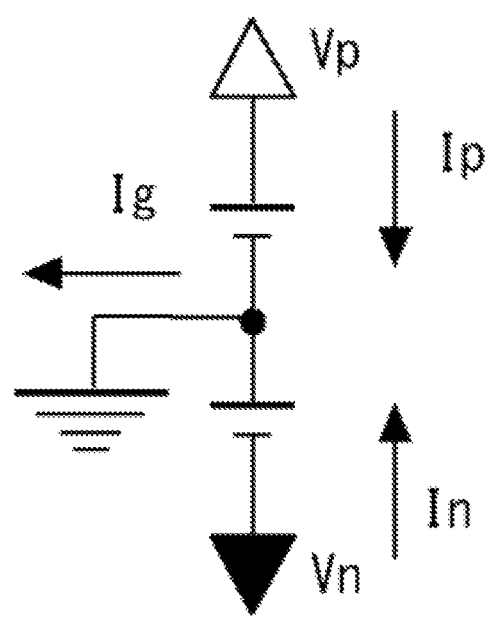
FIG. 3 is a diagram for describing monitoring the behavior of a filter power in the first embodiment of the present invention.

The active filter 10 of the example application of the present invention includes as a configuration element, a dual power module provided with a positive power source P1 which supplies a positive voltage (Vp) power and a negative power source P2 which supplies a negative voltage (Vn) power for driving the above-described active element. The noise filter 1 according to the example application of the present invention is provided with an abnormality detector unit 30 for monitoring the behavior of the power which supplies operative power to the active elements, etc., in the active filter 10, and measuring the current of the power that is supplied from the above-described dual power source module to the active element, etc., making up the active filter 10. Specifically, as illustrated in FIG. 3, the current (Ip) flowing from the positive power source P1 to a reference potential FG and the current (In) flowing from the negative power source P2 into the reference potential FG. The current (Ig) flowing from a connection point that connects the negative-side electrode of the positive power source P1 and the positive-side electrode of the negative power source P2 into the reference potential FG is also measured.

Figure 4:
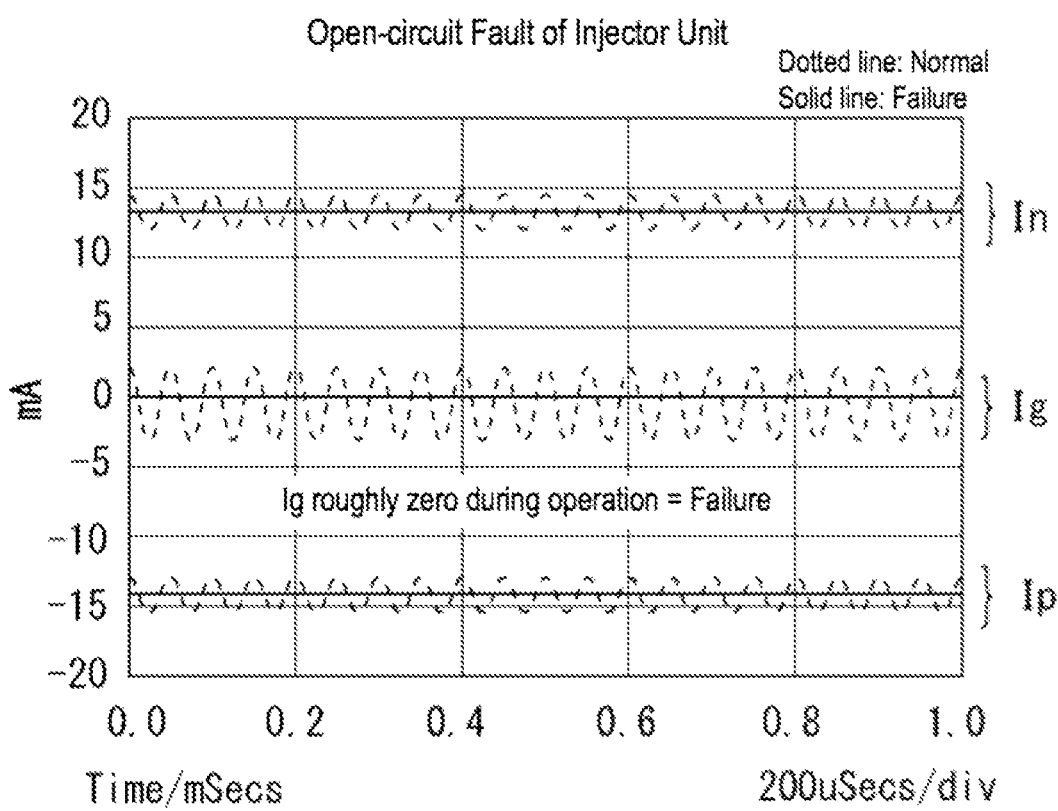
FIG. 4 is one example of a graph modeling a variation in a current accompanying the failure of an active filter in the first embodiment of the present invention.
Figure 5:
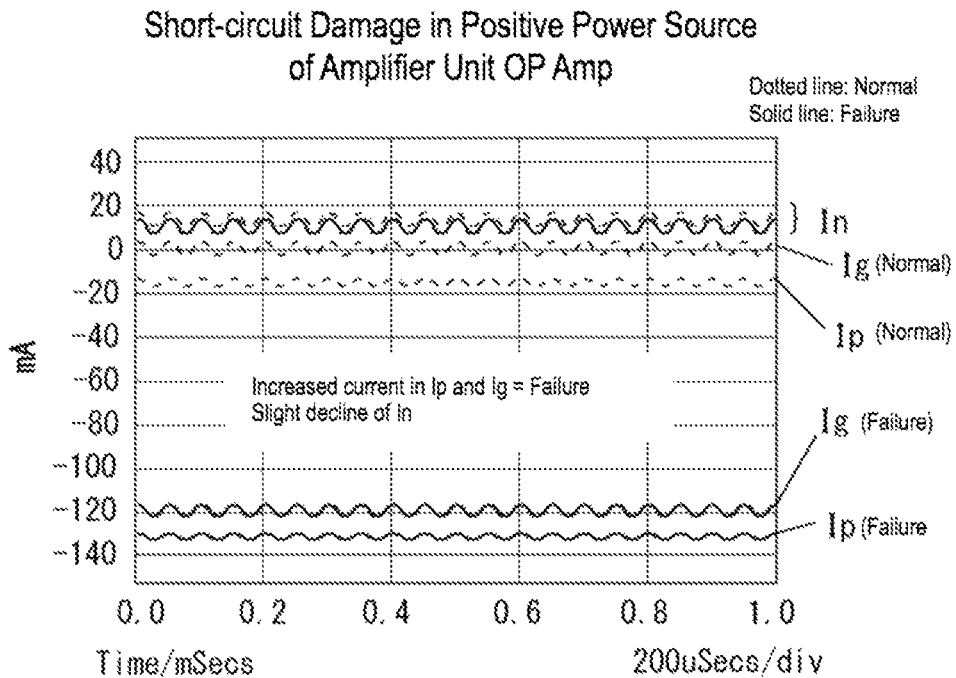
FIG. 5 is one example of a graph modeling a variation in a current accompanying the failure of the active filter in the first embodiment of the present invention.
Figure 6:
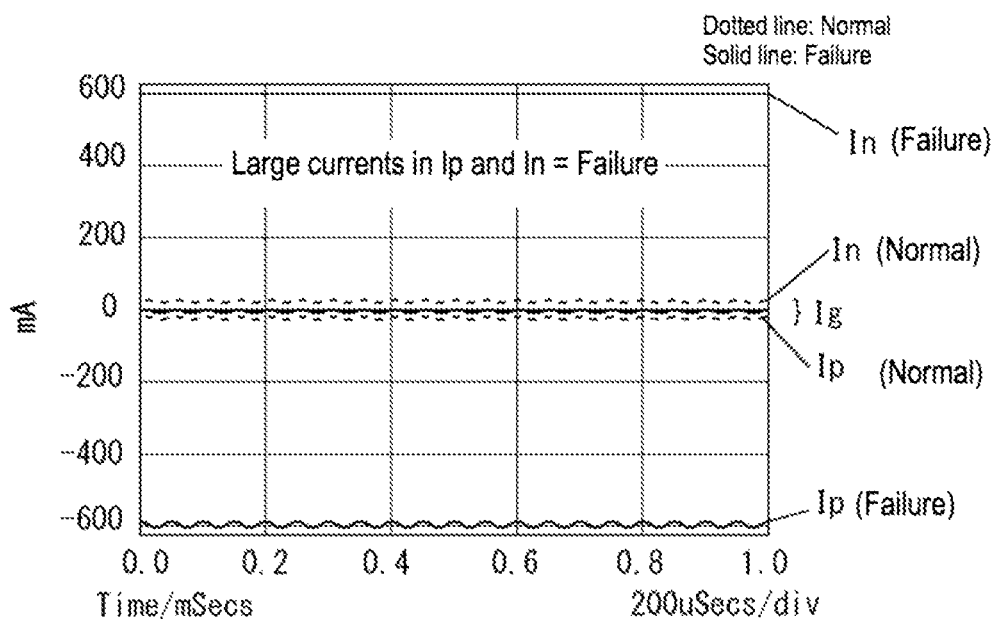
FIG. 6 is one example of a graph modeling a variation in a current accompanying the failure of the active filter in the first embodiment of the present invention.

As illustrated in FIG. 4 through FIG. 6, when an open-circuit fault or a short-circuit fault occurs in the circuit configuration which includes the active filter 10, the currents Ip, In, Ig supplied from the dual power source module to the active elements etc. change significantly. An abnormality in the aforementioned active filter 10 may be diagnosed by monitoring the behavior of the power by measuring at least two among three of the currents, that is, the current Ig, and current In or current Ip in the active filter 10 according to the example application of the present invention.

FIG. 7 shows an example table presenting a condition for a failure assessment of the currents Ip, In, Ig respectively with regard to failure diagnosis points in the active filter 10. At least the current Ig and current In, or current Ip are measured in the noise filter 1 according to the example application of the present invention via a current measuring function 31 in the abnormality detector unit 30. The abnormality diagnosis function 32 in the abnormality detector unit 30 diagnoses a failure of the active filter 10, where an assessment condition is that each of the currents measured is within a predetermined threshold value. If the active filter 10 is diagnosed as being normal in the noise filter 1 according to the example application of the present invention, the power converter device 100 having the noise filter 1 included in the configuration thereof continues to operate. Whereas, if the active filter 10 is diagnosed as having failed, the operation of the power converter device 100 having the noise filter 1 in the configuration thereof is suspended. Consequently, the noise filter 1 according to the example application of the present invention detects the failure of the noise filter that includes an active filter in the configuration thereof, and makes it possible to prevent conduction noise from propagating to surrounding machines.

First Embodiment

A noise filter in a power converter device according to an embodiment of the present invention is described in detail below with reference to the drawings.

System Configuration

FIG. 1 is a block diagram illustrating a schematic configuration of a power system 100 installed on a customer's premises. The power system 100 illustrated in FIG. 1 is a grid-connected system that interconnects a DC power supply 101 which supplies direct-current power and a commercial power grid 103 (also referred to as "grid" below), which supplies alternating-current power. The power system 100 is provided with a power converter device 102 (power conditioner) for converting the direct-current power supplied from a DC power supply 101 such as a solar power module, storage battery, an EV, etc., to a predetermined alternating-current power (e.g., single-phase, three-wire, 200/100V). The predetermined alternating-current power converted by the power converter device 102 is supplied to a lighting installation, load, or the like (not shown) provided on a customer's premises, or is supplied to an interconnected grid 103. The power converter device 102 converts the alternating-current power supplied from the grid 103 to a predetermined direct-current power. The direct-current power converted by the power converter device 102 is supplied to a connected storage battery or EV, etc., as the DC power supply 101.

The power converter device 102 includes in the configuration thereof a DC-DC converter 102b and an inverter 102c for converting direct-current power supplied from the DC power supply 101 to alternating-current power synchronized with the power supplied from the grid, or converting the alternating-current power supplied from the grid to direct-current power synchronized with the power supplied from the DC power supply 101. The power converter device 102 also includes in the configuration thereof a DCF 102a and an ACF 102d, also called a noise filter, for minimizing the conduction noise (common mode noise or normal mode noise) produced in a conversion process from direct-current power to alternating-current power or alternating-current power to direct-current power (boost/buck conversion, frequency conversion, etc.). The DCF 102a inside the noise filter is provided at the input-output end parts on the DC power supply 101 side of a power converter unit 102, and the ACF 102d is provided at the input-output end parts on the grid side 103 of the power converter unit 102. The DCF 102a and ACF 102d have different voltage specifications, current specifications, or the like in accordance with the difference in direct current and alternating current; however, the constituent parts making up the respective circuits may be roughly the same. The DCF 102a and the ACF 102d are jointly referred to as simply the "noise filter".

Noise Filter Configuration

FIG. 2 is a block diagram illustrating a resource circuit configuration of a noise filter 1 according to the first embodiment of the present invention. The noise filter 1 illustrated in FIG. 2 is a hybrid noise filter, which includes a passive filter 20 and an active filter 10 in the configuration thereof. The active filter 10 detects the high-frequency component in the conduction noise propagating to the power line and functions to reduce the harmonic current corresponding to the aforementioned high-frequency component. The size of the noise filter 1 according to this embodiment can be minimize even when performing power conversion on the order of several kilowatts by combining a passive filter 20 configured from a passive element and an active filter 10 that includes an active element in the circuit configuration with an operational amplifier, a transistor, or the like. The noise filter 1 according to this embodiment may further includes an abnormality detector unit 30 for the purpose of monitoring the behavior of the power supplied as operation power with respect to the active element, etc., in the active filter 10 etc. The abnormality detector unit 30 measures the current of the power supplied to the active element, etc., in the noise filter 1 that is energized and an energized state for example. The abnormality detector unit 30 diagnoses an abnormality of the active filter 10, which includes an active element, etc., on the basis of variation in the state of the current measured.

The passive filter 20 is provided on the noise-generating side of the power converter device 102 in the noise filter 1 according to the present embodiment. For example, when the noise filter 1 is functioning as the DFC 102a illustrated in FIG. 1, the power line connecting the DC-DC converter 102b and the DFC 102a in the power converter device 102 is connected to the terminal 20a, 20b of the passive filter 20. The power line that connects the aforementioned DFC and the DC power supply 101, which is a direct-current power source, is connected to the terminal 20c, 20d of the passive filter 20. Whereas, when the noise filter 1 is functioning as the AFC 102d illustrated in FIG. 1, the power line joining the inverter 102c in the power converter device 102 and the AFC 102d is connected to the terminals 20a, 20b of the passive filter 20. The power line joining the aforementioned AFC and the grid 103, which is the alternating-current power source, is connected to the terminals 20c, 20d of the passive filter 20.

The passive filter 20 is constituted by a reactor CMC, which is a passive element, capacitors (C1, C2) that are provided on the noise source side, and capacitors (C3, C4) that are provided on the direct-current power source side (DC power supply 101) or alternating-current power source side (grid 103). The capacitors C1 and C2, which are provided on the noise source side, and the capacitors C3 and C4, which are provided on the direct-current or alternating-current power source side are connected to the power lines and the frame ground (FG), etc., which is the reference potential and serve as a Y capacitor that is for allowing the common mode noise current propagating to the power lines to escape to the FG, etc. The reactor CMC and the aforementioned Y capacitor provided on the noise source side and the Y capacitor provided at the power source constitute an LC filter.

The active filter 10 according to this embodiment is connected to the terminal 20c and the terminal 20d of the power line on the power source side (DC power supply 101, grid 103) supplying the direct-current or alternating-current power for the passive filter 20. The active filter 10 includes a circuit configuration that serves as a filter power source 11, a detector unit 12, an amplifier unit 13, and an injector unit 14. The filter power source 11 is a dual power source module including a positive power source P1 that supplies power of a positive voltage (Vp) and a negative power source P2 that supplies power of a negative voltage (Vn) as constituent elements therein. The connection point that connects the negative-side electrode of the positive power source P1 and the positive-side electrode of the negative power source P2 is grounded at the frame ground (FG), etc., which is a reference potential.

The detector unit 12 in the active filter 10 detects the high-frequency component in the conduction noise that propagates to the power line on the power source side (DC power supply 101, grid 103) of the passive filter 20 which is combined with the aforementioned filter. The high-frequency component detected is output to the amplifier unit 13. One end of the capacitor C5 constituting the detector unit 12 is connected to the terminal 20c of the power line and one end of the capacitor C6 is connected to the terminal 20d of the power line. The other end of the capacitor C5 which is connected to the terminal 20c and the other end of the capacitor C6 which is connected to the terminal 20d are connected to the reference potential (FG, etc.) through a resistor R1. The capacitor C5 and the resistor R1 constitute a high pass filter (HPF) that transmits the high-frequency component in the conduction noise propagating to the power line to which the terminal 20c is connected; the capacitor C6 and the resistor R1 constitute a high pass filter (HPF) that transmits the high-frequency component in the conduction noise propagating to the power line. The high-frequency component of the conduction noise, which is transmitted by the high pass filter, passes through a capacitor C7 and resistor R2, which are connected in series, and is output to the amplifier unit 13 as a voltage fluctuation responsive to the aforementioned high-frequency component.

The amplifier unit 13 includes in the configuration thereof an operational amplifier 13a, and active elements, that is, an NPN transistor TR1 and a PNP transistor TR2. The operational amplifier 13a is supplied a positive voltage (Vp) power and negative voltage (Vn) power from the filter power source 11 as the drive power. The collector of the transistor TR1 is similarly supplied a positive voltage (Vp)

power from the filter power source 11 as the drive power, and the collector of the transistor TR2 is similarly supplied the negative voltage (Vn) power from the filter power source 11 as the drive power.

The voltage fluctuation in accordance with the high-frequency component output from the detector unit 12 enters the inverting input terminal 2 of the operational amplifier 13a. A voltage enters the non-inverting input terminal 3 of the operational amplifier 13a, the voltage serves as a reference for differential operation and is connected to the reference potential FG via the resistor R3. The operational amplifier 13a amplifies the voltage difference between the current fluctuation that entered the inverting input terminal 2 and the reference voltage that entered the non-inverting input terminal 3 and outputs the result to the output terminal 1. The diodes D1, D2 are connected to the inverting input terminal 2 of the operational amplifier 13a to protect the aforementioned operational amplifier 13a from input overvoltage. The voltage difference output from the output terminal 1 passes through a resistor 4 and enters the base of the transistors (TR1, TR2) to which an emitter is mutually connected, to amplify the current. The base of the transistor TR1 is connected to the anode of a diode D3 and the base of the transistor TR2 is connected to the cathode of a diode D4. The voltage difference output from the output terminal 1 is connected to the cathode side of the diode D3 and to the anode side of the diode D4. A positive voltage (Vp) is applied to the anode side of the diode D3 via a resistor R5 and a negative voltage (Vn) is applied to the cathode side of the diode D4 via a resistor R6. The voltage fluctuation of the voltage difference causes the current between the emitter/base of the transistors TR1, T1 to change, while at the collector/emitter, a collector current in accordance with the amplification level of the aforementioned transistors is output as a harmonic current. The harmonic current output from the emitters of the transistors TR1 and TR2 is fed back and input to the inverting input terminal 2 of the operational amplifier 13a via a low pass filter configured from a resistor R7 and a capacitor C8. As a result, the output current of the active filter 10 is controlled so that the active filter 10 reduces the harmonic current in the current flowing in the power line to which the terminals 20c, 20d are connected in accordance with the harmonic current fed back and input to the inverting input terminal 2.

The output current that is output from the emitters of the transistors enters the injector unit 14. The output current that enters the injector unit 14 is injected via a resistor R8 and a capacitor C9 into the power line to which the terminal 20c is connected, and is injected via the resistor R8 and a capacitor C10 into the power line to which the terminal 20d is connected.

The abnormality detector unit 30 is control module having a current measuring function 31 and an abnormality diagnosing function 32. A control microprocessor is a typical example of what may serve as the abnormality detector unit 30. The abnormality detector unit 30 monitors the behavior of the positive voltage (Vp) and the negative voltage (Vn) supplied to the active elements from the filter power source 11 to cause the active filter 10 to function, and diagnoses any abnormality in the aforementioned active filter.

FIG. 3 is a diagram for describing with regard to monitoring the current supplied as the drive power from the filter power source 11 to drive the active elements. As illustrated in FIG. 2, the behavior of current supplied from the filter power source 11 to the active elements can be monitored, for instance, by measuring the current (Ip) flowing from the positive power source P1 to the reference potential FG and the current (In) flowing from the negative power source P2 into the reference potential FG. The behavior of the current supplied to the active elements can also be monitored by measuring the current (Ig) flowing from the connection point that connects the negative-side electrode of the positive power source P1 and the positive-side electrode of the negative power source P2 into the reference potential FG.

The behavior of the filter power source 11 may also be monitored, for instance, by measuring the positive voltage (Vp) and the negative voltage (Vn). The characteristics of the dual power-source module employed by the filter power source 11 may be configured so that, for instance, the power source reduces the voltage at the time of failure by increasing the current flowing to the reference potential (FG) side. The current waveform of the current (Ig) flowing from the connection point that connects the negative-side electrode of the positive power source P1 and the positive-side electrode of the negative power source P2 into the reference potential FG side may also be established as a parameter to be monitored; for example, the failure of the active filter 10 can be detected under the condition of monitoring a current waveform where the DC component and not the AC component is the main constituent.

Within the circuit configuration of the active filter 10, the amplifier unit 13, which includes the operational amplifier 13a and the transistors (TR1, TR2), which are active elements, can be said to be a location tends to fail. The injector unit 14 injects the output current controlled by the active filter 10 to reduce the harmonic current into the power line; even when configured with passive elements, the injector unit 14 can be said to be a location with a high level of impact on surrounding machines when there is a failure. Accordingly, the abnormality detector unit 30 in the noise filter 1 measures the currents Ip, In, Ig from the filter power source 11 via the current measuring function 31. The abnormality detector unit 30 diagnoses an abnormality in the active filter 10 using the abnormality diagnosing function 32 on the basis of the each of the currents measured via the current measuring function 31 with the amplifier unit 13 and the injector unit 14 as the primary targets thereof.

The variation in current that accompanies a failure in the active filter 10 is described next with references to FIGS. 4 through 6. FIG. 4 is one example of a graph modeling a variation in current when the injector unit 14 in the active filter 10 undergoes an open-circuit fault (disconnected state). As an example of an open-circuit fault in the injector unit 14, the resistor R8 may be damaged due to over-current. The vertical axis of the simulation graph in FIG. 4 represents the current (mA), and the horizontal axis represents the time (μsec). In FIG. 4, the graphs shown in dotted line represent the change in the current during normal operation, and the graphs shown in solid lines represent the change in the current during a failure. The properties of the vertical axis and horizontal axis of the graphs indicating the variation in current in FIG. 4, the display properties of the graphs are the same with regard to FIG. 5 and FIG. 6.

When a failure occurs due to open-circuit damage of the injector unit 14, the currents Ip and In flowing to the filter power source 11 are in a state in which the fluctuation band due to the AC component of is roughly zero and a fixed current continues to be measured. Similarly, in the current Ig, the fluctuation band due to the AC component is roughly zero, and the current flowing to the reference potential FG is roughly zero. As illustrated by the dotted line, the fluctuation band of the current Ig during normal operation is relatively large compared to the fluctuation band of the currents Ip, In during normal operation. Therefore, it is possible to detect an open-circuit fault in the injector unit 14 while the power converter device 102 is operating, on the basis of the fluctuation band of the current Ig measured from the filter power source 11. However, as illustrated by the solid line, when there is a failure, the currents Ip and In are in a constant current state in which the fluctuation band due to the AC component is roughly zero; therefore, it is possible to detect an open-circuit fault of the injector unit 14 with measuring this constant current state as a condition therefor.

FIG. 5 is one example of a graph modeling a variation in current when the positive voltage (Vp) of the operational amplifier 13a making up the amplifier unit 13 in the active filter 10 experiences a short-circuit fault. As illustrated in FIG. 5, during normal operation, the current Ip changes to near −10 mA including the fluctuation band due to the AC component and the current Ig changes to near 0 mA including the fluctuation band due to the AC component. When a short-circuit fault occurs, the currents Ip and Ig change while making a large shift toward the negative current (approximately 120 mA in the example illustrated). In contrast, although the current In deteriorates slightly before and after the failure, the current In changes near 10 mA including the fluctuation band due to the AC component. Accordingly, it is possible to detect a short-circuit fault on the positive voltage (Vp) side of the operational amplifier 13a on the basis of the variation in state of the currents Ip, Ig measured from the filter power source 11 in the power converter device 102.

FIG. 6 is one example of a graph modeling a variation in current when the transistors (TR1, TR1) making up the amplifier unit 13 in the active filter 10 experiences a short-circuit fault. As illustrated in FIG. 6, during normal operation, the currents change near 0 mA including the fluctuation band due to the AC component. However, when a short-circuit fault occurs, the current Ip makes a large shift toward the negative current side (approximately 600 mA in the example illustrated) and the current In makes a large shift toward the positive current side (approximately 600 mA in the example illustrated). Note that, the current In changes near 0 mA including the fluctuation band due to the AC component even in when a failure occurs. Accordingly, it is possible to detect a short-circuit fault of the transistors (TR1, TR2) making up the amplifier unit 13 on the basis of the variation in the state of the currents Ip, In measured from the filter power source 11 in the power converter device 102.

FIG. 7 illustrates the results of running a simulation with regard to an open-circuit fault and a short-circuit fault (short), which are causes of failure, with respect to the amplifier unit 13 and injector unit 14 respectively in the active filter 10. FIG. 7 shows one example of a table presenting a condition for a failure assessment of the currents Ip, In, Ig respectively with regard to failure diagnosis points in the active filter 10.

As illustrated in FIG. 7, the failure due to an open-circuit fault and short-circuit fault of the transistors (TR1, TR2) in the amplifier unit 13 can be diagnosed using a measurement value for a power Ip and a power In. The open-circuit fault with respect to the operational amplifier 13a in the amplifier unit 13 can be diagnosed using the measurement value of the power Ip or the power In; the short-circuit fault may be diagnosed using at least two measurement values among the currents Ip, In, Ig. An open-circuit fault and a short-circuit fault with respect to the injector unit 14 can be diagnosed using the measurement value of the power Ig. Accordingly, the abnormality detector unit 30 in a noise filter according to this embodiment is able to diagnose an abnormality in the active filter 10 using at least two measurement values (power Ig and power Ip or power In) among the currents Ip, In, Ig.

An open-circuit fault in the transistors (TR1, TR2) of the amplifier unit 13 is assessed as a failure of the aforementioned location under the condition that the power Ip or the power In measured is less than a threshold A. Meanwhile, a short-circuit fault in the transistors (TR1, TR2) of the amplifier unit 13 is assessed as a failure of the aforementioned location under the condition that the power Ip or the power In measured is greater than a threshold B.

An open-circuit fault with respect to the operational amplifier 13a of the amplifier unit 13 is assessed as a failure of the aforementioned location under the condition that the power Ip or the power In measured is less than a threshold A. Meanwhile, a short-circuit fault with respect to the operational amplifier 13a of the amplifier unit 13 is assessed as a failure of the aforementioned location under the condition that at least two of the powers Ip, In, Ig measured is greater than a threshold B. An open-circuit fault with respect to the injector unit 14 is assessed as a failure of the aforementioned location under the condition that the power Ig measured is less than a threshold C. Further, a short-circuit fault in the injector unit 14 is assessed as a failure of the aforementioned location under the condition that the power Ig measured is greater than a threshold D.

A short-circuit fault in the operational amplifier 13a needed the measurement values with respect to at least two powers among the power Ip, In, Ig; however, if the current measurement accuracy is sufficient, the failure of the aforementioned location can be detected with even a single current measurement using the variation in current during normal operation and during a failure of the current In as illustrated in FIG. 5.

The timing for performing a failure assessment on the active filter 10 may be on start up of the power converter device 100, and before starting operations for a power conversion process with respect to power supplied from an interconnected DC power supply 101 or grid 102. The operation of the power converter device 100 can be suspended by detecting a failure in the active filter 10 at the aforementioned timing; therefore, the conduction noise that could be generated due to a power conversion process can be prevented from propagating to surrounding machines that are interconnected.

After the operation of the power converter device 100 begins, an output current controlled to reduce the harmonic current is injected into the power line by the active filter 10 through the injector unit 14. Accordingly, the timing for failure assessment of the aforementioned injector unit 14 may be after the start of operation of the power converter device 100. Performing the failure assessment of the injector unit 14 during operation essentially prevents the harmonic current in the conduction noise on the power line being reduced by the active filter 10 from propagating to surrounding machines while the harmonic current is not being reduced due to the failure of the injector unit 14. If no failure is detected for the injector unit 14, the abnormality detector unit 30 may skip the failure assessment of the injector unit 14 after operation begins.

Flow of Processing

Figure 8:
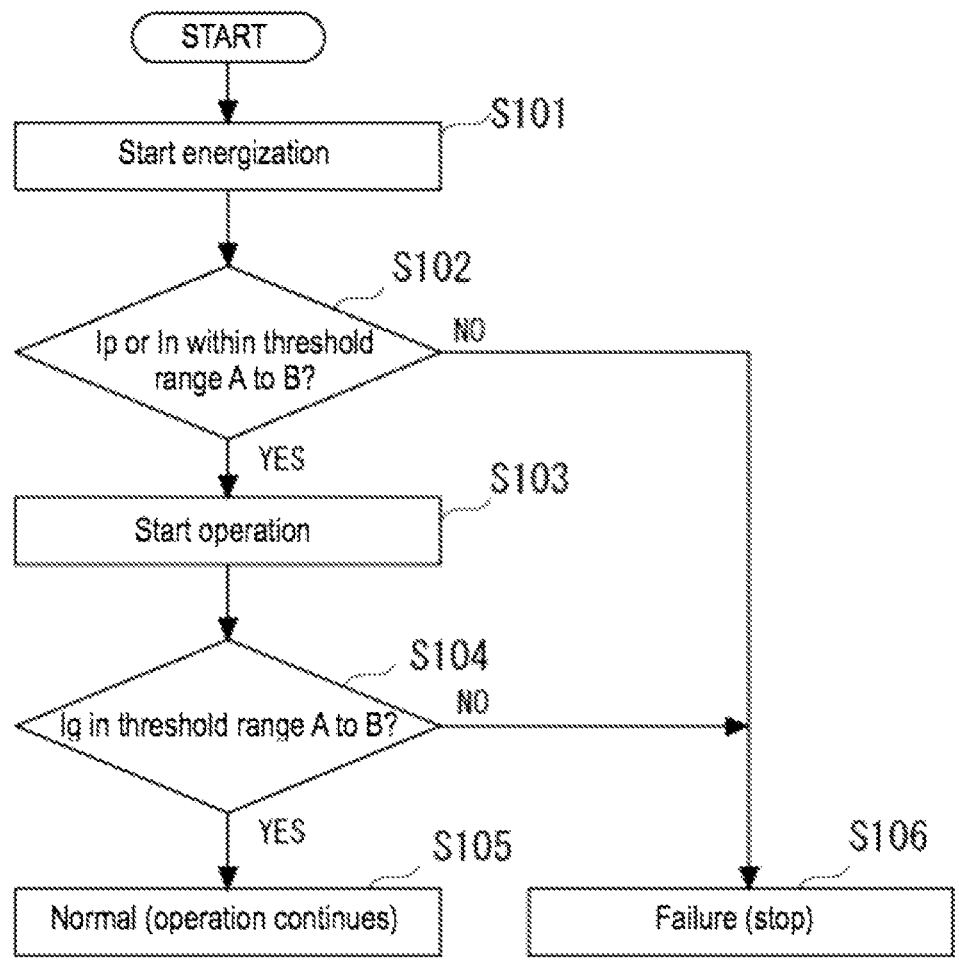
FIG. 8 is a flowchart illustrating one example of failure diagnosis processing for the noise filter of the first embodiment of the present invention.

FIG. 8 is a flowchart illustrating one example of failure diagnosis processing for the noise filter of the present embodiment. The failure diagnosis of the noise filter 1 in the flow in FIG. 8 is performed using two of the currents among the current Ig, and current Ip or current In. First, when the power converter device 100 is started, the noise filter 1 of this embodiment is energized and the filter power source 11 energizes the amplifier unit 13. When the current measuring function 31 in the abnormality detector unit 30 acquires measurement values of two of the currents (Ig, and Ip or In) that are t be measured from filter power source 11 that is now energized, and processing continues to step S102. It is determined in step S102 whether the current Ip or the current In measured are within a range from the threshold value A to the threshold value B. If the current Ip or the current In measured are within a range from the threshold value A to the threshold value B (step S102, "YES"), processing continues to step S103 and operation of the power converter device 100 begins. Whereas, if the current Ip or the current In measured are outside the range from the threshold value A to the threshold value B (step S102, "NO"), processing continues to step S106 and the failure of the noise filter 1 is diagnosed. The power converter device 100, which includes a noise filter 1 in the configuration thereof, suspends the operation of the aforementioned power converter device 100 if the abnormality diagnosing function 31 determines there is a failure.

After operations starts, it is determined in step S104 whether the current Ig measured is within range from a threshold value C to a threshold value D. If the current Ig measured is within the range from the threshold value C to the threshold value D (step S104, "YES"), processing continues to step S105 and the noise filter 1 is determined to be in normal operation. The operation continues for the power converter device 100 that includes the noise filter 1 in the configuration thereof. Whereas, if the current Ig measured is outside the range from the threshold value C to the threshold value D (step S104, "NO"), processing continues to step S106 and the failure of the noise filter 1 is diagnosed. The power converter device 100 suspends the operation of the aforementioned power converter device 100 that was started in step S103. Once the processing in steps S105, S106, the present routine ends for the time being.

As heretofore described, the behavior of the filter power source 11 in the active filter 10 making up the noise filter 1 is monitored and the failure or normal operation of the aforementioned active filter 10 is diagnosed. If the active filter 10 is diagnosed as being normal in this embodiment, the power converter device 100 having the noise filter 1 included in the configuration thereof continues to operate. Whereas, if the active filter 10 is diagnosed as having failed, the operation of the power converter device 100 having the noise filter 1 in the configuration thereof can be suspended. This embodiment detects a failure of a noise filter that includes an active filter in the configuration thereof and prevents the conduction noise from propagating to surrounding machines.

The current Ip flowing from the positive power source P1 into the reference potential FG, the current In flowing from the negative power source P2 into the reference potential FG, and the current Ig flowing from a connection point connecting the negative-side electrode of the positive power source P1 and the positive-side electrode of the negative power source P2 into the reference potential FG can be measured in this embodiment to serve as information for monitoring the behavior of the filter power source 11. The open-circuit fault and short-circuit fault in a circuit configuration that includes an active element in an active filter 10 may be diagnosed on the basis of a variation in the state of measured values by measuring the current Ip or the current In. The open-circuit fault and short-circuit fault in a circuit configuration that does not include an active element in an active filter 10 may be diagnosed on the basis of a variation in the state of measured values by measuring the current Ig. Accordingly, this embodiment allows for assessing the open-circuit fault or short-circuit fault of a circuit configuration that does not include active elements by measuring at least two of the currents among the current Ig, and the current Ip or the current In; therefore, this embodiment improves the assessment accuracy of a failure diagnosis.

The timing for performing a failure assessment on the active filter 10 in this embodiment may be on start up of the power converter device 100, and before starting operations for a power conversion process with respect to power supplied from an interconnected DC power supply 101 or grid 102. [error] A failure in the active filter 10 can be diagnosed prior the start of operation of a power converter device 100 that includes the noise filter 1 in the configuration thereof; therefore, it is possible to prevent the conduction noise that could be generated from a power conversion process from propagating to surrounding machines that are interconnected. This embodiment prevents a power converter device 100 from operating with a failed active filter 10 before it happens.

In this embodiment, failure assessment of the active filter 10 is possible event after the operation of the power converter device 100 has started. Therefore, this essentially prevents the harmonic current in the conduction noise on the power line, which is reduced by the active filter 10 from propagating while not reduced due to the failure of the active filter 10, and negatively impacting the operation of surrounding machines. This embodiment prevents a power converter device 100 from continuing to operate with a failed active filter 10.

Second Embodiment

Figure 9:
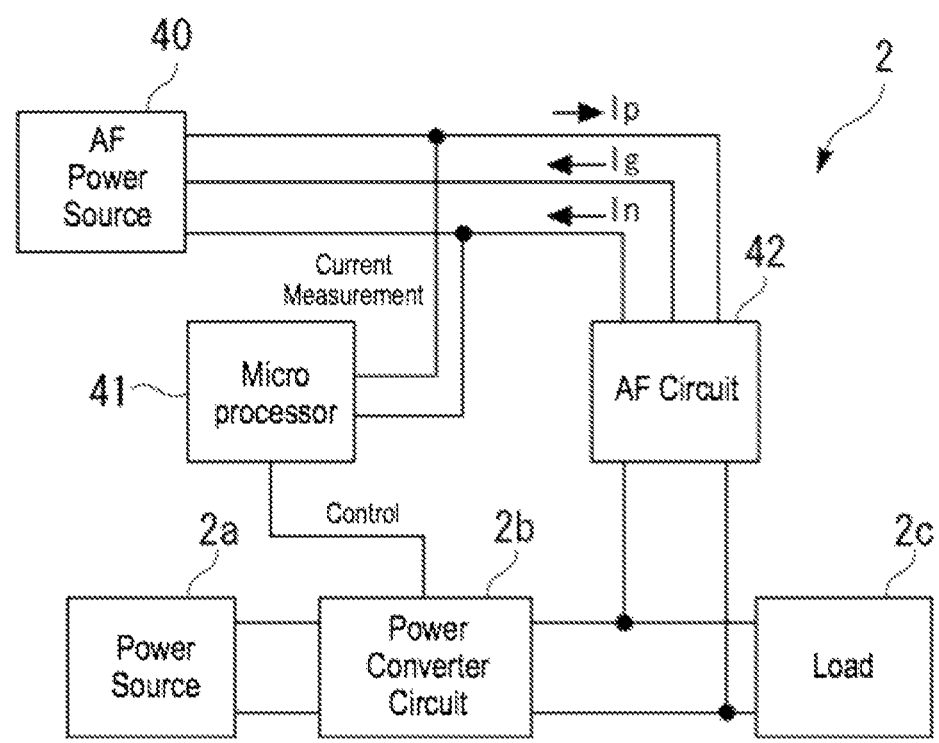
FIG. 9 is a block diagram illustrating a schematic configuration of a noise filter in a second embodiment of the present invention.

FIG. 9 is a block diagram illustrating a resource configuration of a noise filter 2 according to a second embodiment. In the first embodiment the active filter 10 of the noise filter 1 is provided with a noise filter power source 11 as a drive power source for the active elements, and is configured to measure currents Ip, In, Ig from the aforementioned power source with respect to a failure diagnosis. In the second embodiment the noise filter 2 is provided with an AF circuit 42 that is configured from a detector unit 12, an amplifier unit 13, and extractor unit 14 to serve as the active filter. The second embodiment is configured so that an externally provided AF power source 40 supplies positive voltage (Vp) and negative voltage (Vn) to the AF circuit 42. Thus, a configuration may be adopted wherein the driving power source for the active element is provided externally. The currents Ip, In that are supplied from the AF power source 40 to the AF circuit 42 are measured with a control microprocessor 41 in the power converter device 100. Even with this configuration, similarly to the first embodiment, the behavior of the AF power source 40 that supplies the AF circuit 42 is monitored, and a failure or normal operation is diagnosed for the noise filter 2, which includes the aforementioned AF circuit.

The control microprocessor 41 in the power converter device 100 performs failure diagnosis of the AF circuit 42 on the basis of two of the currents among the currents Ip, In, Ig measured. The control microprocessor 41 is capable of suspending the functions of a power converter circuit 2b when the AF circuit 42 is diagnosed to be in a state of failure. The power source 2a illustrated in FIG. 9 corresponds to the DC power supply 101 and grid 103 in the first embodiment, and the power converter circuit 2b corresponds to the DC-DC converter 102b and the inverter 102c in the first embodiment. The power converted by way of the power converter circuit 2b is supplied to a load 2c connected to the aforementioned power converter device.

The noise filter 2 according to this embodiment does not include the filter power source 11 and the abnormality detector unit 30 in the circuit configuration thereof; therefore, compared to the noise filter 1 in the first embodiment, the noise filter 2 can have a relatively small footprint and makes it possible to cut production costs by reducing the number of parts. The control microprocessor 41 can be made to perform the functions of the abnormality detector unit 30, making it possible to reduce the power consumption of the power converter device 100.

Modification Example

Figure 10:
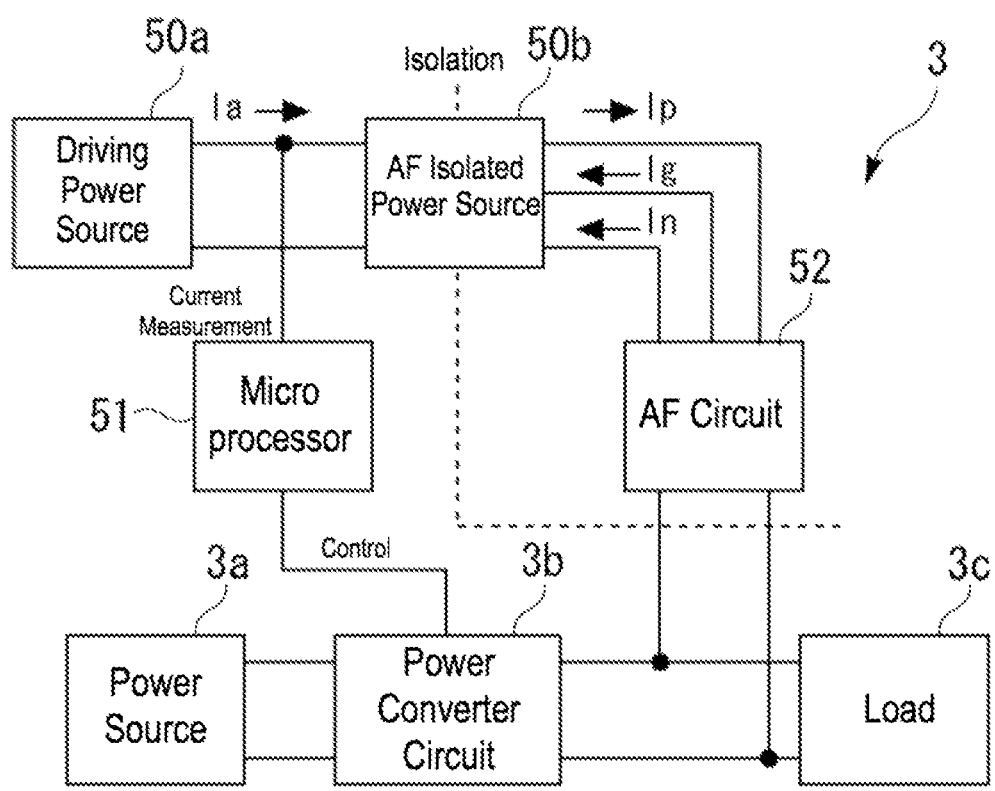
FIG. 10 is a block diagram illustrating a schematic configuration of a noise filter in a modification example of the second embodiment of the present invention.

FIG. 10 is a block diagram illustrating a resource configuration of a noise filter 3 according to a modification example of the second embodiment. The second embodiment is configured so that the current Ip of the positive power, the current In of the negative power, and the current Ig flowing into the reference potential FG that are supplied from the AF power source 40 to the AF circuit 42 are measured with the control microprocessor 41 in the power converter device 100. Therefore, the reference potential with respect to failure detection needs to be the ground of the control microprocessor 41. The modification example is further provided with an AF isolated power source 50b for supplying power to the AF circuit, and a driving power source 50a for supplying power to the aforementioned isolated power source. A transformer is one example of the AF isolated power source 50b; the transformer converts the power from the driving power source 50a that enters the primary side, and outputs the converted power (power of the AF circuit 52) to the secondary side. In the modification example is configured so that the control microprocessor 51 In the power converter device 100 measures the current Ia supplied to the AF isolated power source 50b. When an open-circuit fault or a short-circuit fault occurs in the AF circuit 52, the state of the power varies for the power supplied from the AF isolated power source 50b compared to during a normal operation. The power state of the power supplied to the primary side of the AF isolated power source 50b from the driving power source 50a varies in accordance with the power state of the secondary side; therefore, the current Ia supplied to the aforementioned AF isolated power source 50b also varies. Even with this configuration, similarly to the first embodiment, the behavior of the AF isolated power source 50b that supplies the AF circuit 52 is monitored, and a failure or normal operation is diagnosed for the noise filter 3, which includes the aforementioned AF circuit.

Figure 11B:
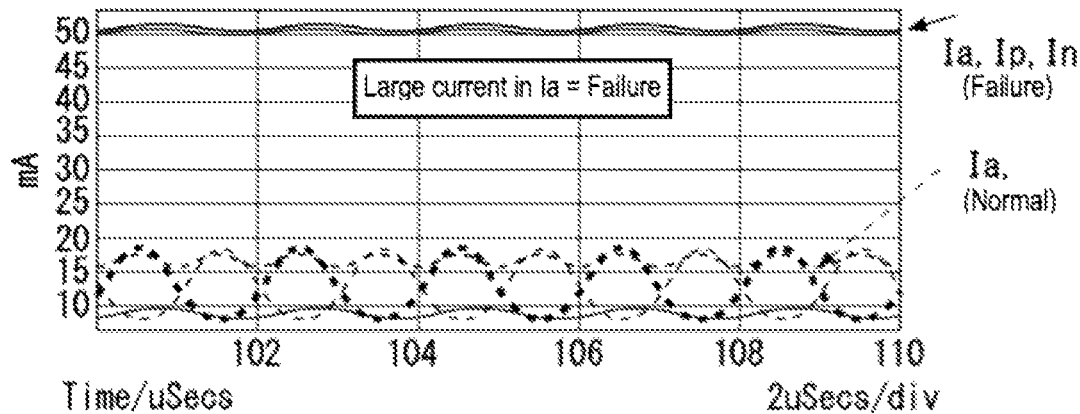
Figure 11C:
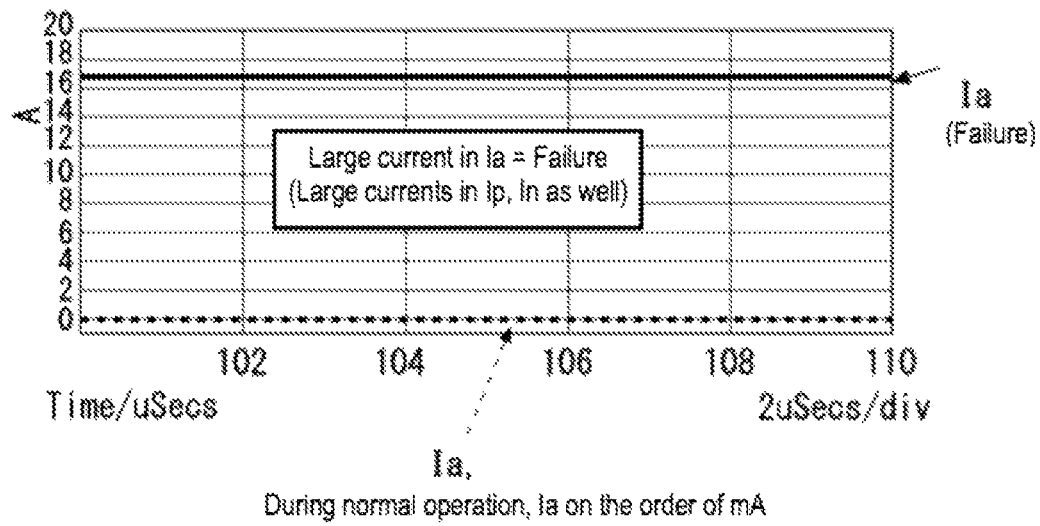
Figure 12:
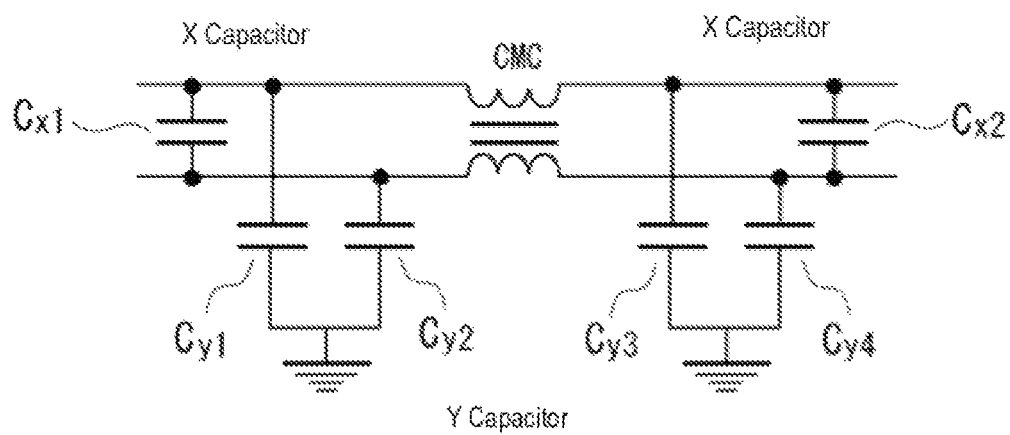
FIG. 12 is a diagram for explaining the configuration of a conventional passive filter.

FIGS. 11A, 11B, and 11C are examples of graphs modeling a variation in a current (Ia) on the primary side and accompanying the failure of the active filter 10 in the modification example. FIG. 11A shows the variation in current when the injector unit 14 in the active filter 10 suffers an open-circuit fault; FIG. 11B shows the variation in current when the positive voltage (Vp) side of the operational amplifier 13a in the amplifier unit 13 suffers a short-circuit fault; and FIG. 11C shows the variation in current when the transistors (TR1, TR2) in the amplifier unit 13 suffer a short-circuit fault. In FIG. 11, the vertical axis represents the current (mA) and the horizontal axis represents time (μsec); the solid line shown in the graph is the change in the current when there is a failure.

As indicated by the dotted arrow in FIG. 11A, the current (Ia) on the primary side fluctuates within a band range of a predetermined band (roughly ±1 mA in the example illustrated) when the injector unit 14 is operating normally. Whereas, as indicated by the solid arrow, the amplitude of the current (Ia) on the primary side is roughly 0 mA and failure standby consumption current flows when open-circuit damage of the injector unit 14 occurs. The standby consumption current at fault is a current defined, for example by the rating of the AF isolated power source 50b; in FIG. 11(a) this is approximately 15.5 mA.

Similarly, the primary side current (Ia), which changes and varies near approximately 15 mA when the positive voltage (Vp) side of the operational amplifier 13a in the amplifier unit 13 suffers a short-circuit fault as indicated by the dotted arrow in FIG. 11B, increases and changes to near approximately 50 mA as indicated by the solid arrow. Moreover, the primary side current (Ia), which changes and varies on the order of mA when the transistors (TR1, TR2) in the amplifier unit 13 suffers a short-circuit fault as indicated by the dotted arrow in FIG. 11C, increases and changes to near approximately 17 mA as indicated by the solid arrow.

Accordingly, even when using the AF isolated power source 50b, it is possible to diagnose the failure or normal operation of a noise filter that includes an AF circuit 52 on the basis of the current (Ia) by detecting the variation in the state of the aforementioned current (Ia), which is supplied from the driving power source 50a to the primary side of the AF isolated power source 50b.

The microprocessor 51 in the power converter device 100 may be made to perform a failure diagnosis of the AF circuit 52 on the basis of the current Ia supplied from the driving power source 50a to the AF isolated power source 50b using the ground, which is a reference potential, of the host device. The control microprocessor 51 is capable of suspending the functions of a power converter circuit 3b when the state of the AF circuit 52 is diagnosed to have suffered a failure. The power source 3a illustrated in FIG. 10 corresponds to the power source 2a in the second embodiment, and the power converter circuit 3b corresponds to the power converter circuit 2b. The power converted by way of the power converter circuit 3b is supplied to a load 3c connected to the aforementioned power converter device.

The present embodiment has the advantage that when the AF circuit 52 in the noise filter 3 fails, a diagnosis can be performed on the basis on only the measurement value for the current Ia supplied from the driving power source 50a to the AF isolated power source 50b. The control microprocessor 51 in the power converter device 100 that includes the noise filter 3 in the configuration thereof makes it possible to reduce the number of input points for measurement with regard to diagnosis; therefore, the available input points can be assigned to other control inputs.

The features in the above-described embodiments and modification examples may be combined within the problems to be addressed by or the scope of the present invention. In the above-described embodiment a solar power module or a storage battery module is provided as an example of the DC power. Instead of the aforementioned, the present invention may be applied to a power system that employs energy modules such as a fuel cell module, a gasoline module, wind generator module, tidal power generator module, hydroelectric power generator module, geothermal power generation module, or a combination thereof.

To allow for comparisons between the constituent elements of the present invention and the configuration in the embodiments, the constituent elements of the invention are described together with reference numerals in the drawings.

Invention 1

A noise filter (1) including: an active filter circuit (10) connected to a power-receiving terminal (20c, 20d) of a power line for an alternating-current power supplied to a power converter device (102) from an alternating-current power grid (103) or a direct-current power source interconnected with the alternating-current power grid (103), or for a direct-current power supplied from the direct-current power source for reducing a harmonic component of a conduction noise propagating to the power line and outputting the reduced harmonic component to the power line; and a controller (30) for monitoring a variation in the state of an input power entering a power source module for generating drive power for an active element constituting the active filter circuit (10), or a variation in the state of the drive power supplied from the power source module, and diagnosing an abnormality of a circuit operation for a circuit including the active element of the active filter circuit (10) therein on the basis of a variation in the state of the input power or a variation in the state of the drive power.

REFERENCE NUMERALS 1, 2, 3: Noise Filter
10: Active Filter
11: Filter Power Source
12: Detector Unit
13: Amplifier Unit
14: Injector Unit
20: Passive Filter
20a, 20b, 20c, 20d: Terminal
30: Abnormality Detector Unit
31: Current measurement function
32: Abnormality diagnosis function
100: Power system
101: DC power supply
102: Power converter device
102a: DCF
102b: DC-DC converter
102c: Inverter
102d: ACF
103: Grid

The invention claimed is:

1. A noise filter comprising:
an active filter circuit connected to a power-receiving terminal of a power line for an alternating-current power supplied to a power converter device from an alternating-current power grid or a direct-current power source interconnected with the alternating-current power grid, or for a direct-current power supplied from the direct-current power source, for reducing a harmonic component of a conduction noise propagating to the power line and outputting the reduced harmonic component to the power line; and
a controller for monitoring a variation in a state of a drive power supplied from a power source module for generating the drive power for an active element constituting the active filter circuit, and diagnosing an abnormality of a circuit operation of a circuit including the active element of the active filter circuit therein on the basis of the variation in the state of the drive power,
wherein the power source module includes a positive power source for generating a positive-side voltage and a negative power source for generating a negative-side voltage, and
wherein the controller monitors the variation in the state of the drive power supplied from the power source module on the basis of at least any one current of a first current flowing from the positive power source of the power source module to a reference potential, a second current flowing from the negative power source in the power source module to the reference potential, and a third current flowing from a connection point connecting a negative-side electrode of the positive power source and a positive-side electrode of the negative power source to the reference potential.

2. The noise filter according to claim 1, wherein when the controller diagnoses that the abnormality has occurred in the circuit operation of the circuit including the active element of the active filter circuit therein on the basis of the variation in the state of the drive power, the controller suspends an operation of the power converter device.

3. The noise filter according to claim 1, wherein when the controller diagnoses that the circuit operation of the circuit including the active element of the active filter circuit therein is normal on the basis of the variation in the state of the drive power, the controller continues an operation of the power converter device.

4. The noise filter according to claim 1, wherein the controller diagnoses the abnormality in the circuit operation of the circuit including the active element of the active filter circuit therein on the basis of the first current or the second current, and the third current.

5. The noise filter according to claim 1, wherein the controller diagnoses that the circuit operation of the circuit including the active element of the active filter circuit therein is normal when the first current or the second current is at or above a first threshold and is at or below a second threshold that is greater than the first threshold.

6. The noise filter according to claim 1, wherein the controller diagnoses that the circuit operation of the circuit including the active element of the active filter circuit therein is normal when the third current is at or above a third first threshold and is at or below a second threshold that is greater than the first threshold.

7. The noise filter according to claim 1, further comprising a passive filter for the power line which is supplied the alternating-current power supplied to a the power converter device from the alternating-current power grid or the direct-current power source interconnected with the alternating-current power grid, or is supplied from the direct-current power source on the power converter device side, for reducing common mode noise propagating to the power line.

* * * * *

UNITED STATES PATENT AND TRADEMARK OFFICE
CERTIFICATE OF CORRECTION

PATENT NO. : 11,984,862 B2
APPLICATION NO. : 17/796452
DATED : May 14, 2024
INVENTOR(S) : Takanori Ishii and Chen Chen Page 1 of 1

It is certified that error appears in the above-identified patent and that said Letters Patent is hereby corrected as shown below:

On the Title Page

Item (56), under FOREIGN PATENT DOCUMENTS:
-JP 108182306 A 7/1996- should read --JP H08182306 A 7/1996--

In the Claims

Claim 7, Column 18, Line 51, should read --alternating-current power supplied to the power converter--

Signed and Sealed this
Thirty-first Day of December, 2024

Derrick Brent
*Acting Director of the United States Patent and Trademark Office*